United States Patent [19]

Ohki et al.

[11] Patent Number: 5,686,364
[45] Date of Patent: Nov. 11, 1997

[54] METHOD FOR PRODUCING SUBSTRATE TO ACHIEVE SEMICONDUCTOR INTEGRATED CIRCUITS

[75] Inventors: Konomu Ohki; Akio Kanai, both of Gunma-ken; Shinji Tanaka, Nagano-ken, all of Japan

[73] Assignee: Shin-Etsu Handotai Co., Ltd., Tokyo, Japan

[21] Appl. No.: 530,601

[22] Filed: Sep. 19, 1995

[30] Foreign Application Priority Data

Sep. 19, 1994 [JP] Japan .................. 6-250008

[51] Int. Cl.⁶ .................................................. H01L 21/00
[52] U.S. Cl. .......................... 438/406; 438/459; 438/938
[58] Field of Search ............................ 437/68, 72, 78, 437/79, 86, 90, 247; 156/631.1, 633.1, 636.1, 648.1, 657.1; 148/DIG. 50

[56] References Cited

U.S. PATENT DOCUMENTS 4,851,078  7/1989  Short et al. .................. 156/648.1 X

FOREIGN PATENT DOCUMENTS 2-44749   2/1990   Japan ................... 437/86
3-265153  11/1991  Japan .
6-21205   1/1994   Japan .

Primary Examiner—William Powell
Attorney, Agent, or Firm—Barnes & Thornburg

[57] ABSTRACT

A method for producing for a SOI type bonded substrate for semiconductor integrated circuits which has a void areal ratio which approaches or is equal to zero %, when heat treated at temperatures on the order of 1250° C. The method involves: superimposing a Si single crystal wafer having a main surface of which is covered by a Si polycrystal layer, beneath which Si single crystal islands are formed on the main surface and are isolated from each other by V grooves with interposition of a dielectric film, which V grooves are filled up by the Si polycrystal layer, and a support made from Si material between the Si polycrystal layer and a surface of the support with a dielectrically insulating layer sandwiched therebetween; and conducting heat treatment of the superimposed Si single crystal wafer and the support to effect bonding therebetween. According to the method any P-V value of recesses between the Si single crystal islands and the V grooves which are formed on the bonding surface of the Si polycrystal layer are set at 13 nm/250×250 μm² or less; and the heat treatment is conducted at a temperature in the range of 1100° C. to 1250° C.

4 Claims, 3 Drawing Sheets

FIG. 1 (bb)

METHOD FOR PRODUCING SUBSTRATE TO ACHIEVE SEMICONDUCTOR INTEGRATED CIRCUITS

BACKGROUND OF THE INVENTION

1. Field of the Invention

The present invention relates to a method for producing a substrate for semiconductor integrated circuit devices. More particularly, the present invention relates to a method for producing a SOI type bonded substrate which incorporates a dielectric isolation technique.

2. Related Prior Art

The dielectric isolation technique, which has conventionally been used for isolation between elements in IC and LSI technologies, can greatly minimize current leakage as compared to p-n junction isolation.

Dielectric isolation has, therefore, such advantages that it can withstand high voltage and further does not require consideration as to the direction of an applied bias voltage.

The dielectric isolation technique is, therefore, widely used in the field of LSI devices which withstand voltages as high as tens of volts to hundreds of volts.

A typical structure of such LSIs is depicted as element identified by reference numeral 1' in FIG. 2, which is the structure of a so-called dielectrically isolated substrate.

The substrate in FIG. 2 comprises: Si single crystal islands 3 each for fabricating semiconductor elements 12; a dielectric film 7 for insulating a plurality of the islands from each other; and a Si polycrystal layer 4, which supports the islands 3.

The Si polycrystal layer 4 is subject to warpage and strain due to heat treatment during the course of forming semiconductor elements 12, because of the difference in expansion coefficients between Si single crystal islands 3 and layer 4, and because of variations in grain sizes of the Si polycrystal and the like.

These warpage and strain affects adversely effect the yield of semiconductor devices and their characteristics.

In light of such circumstances, a recent trial has been made to stabilize the bonding strength and suppress the occurrence of warpage and strain due to the heat treatment by bonding a support 5 and dielectrically isolated substrate 1', wherein support 5 is made of Si material having the same heat expansion coefficient as dielectrically isolated substrate 1', the bonding being effected in a structure to sandwich a dielectrically insulating layer such as Si oxide or glass between support 5 and dielectrically isolated substrate 1' as shown in FIG. 2.

The structure of one such IC substrate produced according to the trial is outlined in reference to FIG. 2 below:

Semiconductor elements 12 are formed in each of the Si single crystal islands 3. A substrate 1' comprises Si single crystal islands 3 and a Si polycrystal layer 4 with a dielectric layer 7 lying therebetween. Substrate 1' is further bonded to a support 5, made of Si material, by a dielectric layer 9 which is sandwiched therebetween.

A method for producing such a substrate for semiconductor integrated circuits is depicted in FIG. 1 and comprises the following steps of: oxidizing a main surface of a Si single crystal wafer 1 to form a $SiO_2$ film thereon; patterning the $SiO_2$ film by photolithography or the like; opening windows by etching or the like at predetermined positions in the $SiO_2$ film to produce a mask; conducting anisotropic etching through the windows in the mask by using a liquid mixture, which comprises potassium hydroxide and iso-propyl alcohol, to form V grooves 6 for isolation; removing the $SiO_2$ film after the anisotropic etchings; oxidizing the grooved main surface to form another $SiO_2$ film 7 for insulation, this layer having a thickness of about 2 μm across the whole surface; providing a Si polycrystal layer 4 by a chemical vapor deposition method (CVD) on the grooved main surface at least until the V grooves 6 are buried completely (FIG. 1(a)); removing the surface region of the Si polycrystal layer 4 by cutting or grinding until the surface becomes smooth and flat overall and relatively large recesses in the surface of the Si polycrystal layer directly above the V grooves 6 disappear, thereby obtaining dielectrically isolated substrate 1' with a single crystal region of the wafer 1 to be later removed for the purpose of exposing Si single crystal islands 3 (FIG. 1(b)); preparing a second Si wafer to be used as a support 5 having a $SiO_2$ layer 9 thereon; superimposing the second Si wafer on the Si polycrystal layer 4 between an oxidized polished surface of the former support 5 and the smoothed surface of the latter layer 4; bonding the superimposed wafers by high temperature treatment (FIG. 1(c)); and after the bonding, removing an unnecessary single crystal portion of the first Si single crystal wafer 1 by polishing so as to form the Si single crystal islands 3, so that the SOI type substrate 20 for semiconductor integrated circuits according to the present invention, is produced (FIG. 1(d)), wherein:

A substrate 20 for semiconductor integrated circuits which has been produced in the aforementioned manner is further treated in a usual semiconductor device fabrication process. The process advances in the following manner: Desired semiconductor elements 12 are formed in the surface region of each of the Si single crystal islands 3; interconnection between semiconductor elements is made by metal film deposition and patterning; such a substrate 20 as processed above is cut into individual pellets; each pellet is soldered on a metal leadframe and further wires are interconnected between the pins of the leadframe and the pellets; and the pellets and metal leadframe are all protected by plastic molding or the like so as to complete a semiconductor integrated circuit device such as power IC.

In case of such a SOI type bonded substrate, if wafer bonding is not perfect, there are risks that thermal stresses, which occur during heat treatments applied during fabrication of semiconductor elements 12 and by heat generated during operation of the elements 12, may cause separation or migration of the Si single crystal islands from or on the support 5. As a result, the interconnections between elements 12 will become disconnected and thus the reliability of the elements of the semiconductor integrated circuit is decreased.

In order to improve wafer bonding attention was focused on the fact that poor bonding and/or voids arise due to the influence of the depth of the V grooves which are provided for isolation purposes. For example, in the publication of Unexamined Patent Application No. HEI 3-265153, a method has been disclosed which comprises the following steps of: forming a buffer layer 9 made of a $SiO_2$ film on the surface of a Si polycrystal layer; polishing the surface of the buffer layer 9 to be smooth, and bonding a support wafer 5 of single crystal to the buffer layer 9.

In the above mentioned prior art, it is difficult to precisely polish the oxide layer due to slow polishing speeds and therefore, it becomes almost impossible (economically) for the surface of buffer layer 9 to be flat enough to be brought in close contact with the surface of support 5 when the two are superimposed.

In light of the difficulty, another method has been proposed in the publication of Unexamined Patent Application No. HEI 6-21205, which includes a step of sandwiching a buffer layer 9, made of $SiO_2$, between a dielectrically isolated substrate 1' and a support 5, where the thickness of the buffer layer is set in the range of 20 nm to 2000 nm.

According to the explanation of the publication of Unexamined Patent Application No. HEI 6-21205, the speed of chemical etching is larger in the regions of V-grooves 6 than in the other regions of polycrystal layer 4. As a result, during mechano-chemical polishing, recesses are produced above V groove 6, each of which recesses has a depth of about 20 nm lower than adjacent plateaus directly above (the bottoms of) islands 3.

In order to achieve complete bonding of a support 5 having recesses as deep as 20 nm on Si polycrystal layer 3 there is a definite need for a sufficient amount of an $SiO_2$ layer on support 5 to at least fill up the recesses, when the $SiO_2$ layer flows around in high temperature heat treatment. If the $SiO_2$ layer is too thick, however, a problem occurs because support wafer 5 is made of single crystal Si and has a larger heat expansion coefficient compared to $SiO_2$. This causes the $SiO_2$ layer to contract and thereby the bonded substrate is warped so as to be convex toward the front surface side. In this prior art, therefore, the thicknesses of the buffer layer 9 is controlled in the range of 20 nm to 2000 nm.

In the heat treatment furnace for bonding the wafers mentioned above, the furnace tube is made of a heat resistant and chemically pure quartz material for the purpose of preventing contamination by metal elements and the like.

The highest temperature which a quartz furnace tube can withstand is generally about 1250° C. Therefore, it is preferable that complete bonding of the aforementioned support wafer 5 be achieved at a temperature lower than this.

In the experiments conducted by the inventors of the present invention it was discovered that when recesses as deep as 20 nm were formed on the surface of polycrystal layer 4 complete bonding of support 5 with the polycrystal layer 4 was difficult to achieve at heat treatment temperatures on the order of 1200° C., even though an $SiO_2$ film of more than 20 nm thick was formed as a buffer layer 9.

Therefore, in the aforementioned prior art, the heat treatment temperatures necessary to achieve bonding have to be set at about 1300° C. Such high temperatures make it impossible to use a quartz glass furnace tube. Accordingly, a furnace tube made of SiC must be used.

In contrast to a quartz glass furnace tube, the use of an SiC furnace tube presents a contamination problem. This contamination problem can be solved by providing the interior wall surface of a SiC furnace tube a coating treatment. However, this CVD coating treatment inevitably results in an increase in the costs of the production facilities for heat treatment and production.

SUMMARY OF THE INVENTION

The present invention was made in light of such deficiencies of the prior art.

It is an object of the present invention to provide a method for producing a substrate for semiconductor integrated circuits that make it possible to achieve complete bonding at a void areal ratio (hereinafter will be defined) which approaches or is equal to zero percent between an oxide-layer covered support wafer 5 and a smoothed surface of a polycrystal layer 4 built-up on a grooved surface of a silicon wafer 1 at heat treatment temperatures on the order of 1250° C., which is the maximum temperature of a quartz glass made furnace tube.

It is another object of the present invention to provide a method for producing a substrate for semiconductor integrated circuits that can realize a void areal ratio that approaches or is equal to zero percent even under conditions of heat treatment at relatively short time periods and low temperatures.

The void areal ratio as used herein is defined as $B/A \times 100$, where A is the total area provided for bonding and B is the total of the areas occupied by voids or non-bonded areas.

The present invention is directed to a method comprising the following steps of: forming V grooves 6 in a main surface of a first Si single crystal wafer 1; forming an oxide layer 7 on the main surface and an inner surface of each V groove 6 in the main surface; depositing a Si polycrystal layer 4 on the main surface to fill up the grooves 6; smoothing the surface of the Si polycrystal layer 4; forming another oxide layer 9 on a main surface of a second Si wafer as support 5; superimposing the Si polycrystal layer 4 and a support 5 with a dielectrically insulating layer 9 sandwiched therebetween; conducting a heat treatment of the Si single crystal wafer 1 and the support 5 as superimposed in order to bond each together; and removing portions of the other main surface region of the first silicon wafer 1 to produce islands 3 by: adjusting any P-V value of recesses 10 within the range of 13 nm/250×250 μm² or less, where a P-V valve is defined as maximum depth measured in nm from the highest point of adjacent plateaus to the lowest bottom of the recesses within a limited area of a square of 250×250 μm² around the recess; and by conducting the heat treatment at a temperature in the range of 1100° C. to 1250° C.

In the method, it is best that the dielectrically insulating layer 9 has a thickness selected in the range of 13 nm to 2000 nm, preferably in the range of 12 nm to 1500 nm and that the minimum thickness in the dielectrically insulating layer 9 is larger than any P-V value available on the surface of the Si polycrystal layer 4.

There is no need for an excessive length of time period for the heat treatment. Bonding of wafers can be performed in heat treatment at a temperature in the range of 1100° C. to 1250° C. in less than 3 hours.

According to one embodiment of the present invention, in order to achieve better bonding it is necessary to control the surface roughness in RMS of a bonding surface to less than 1 nm/250×250 μm², and preferably 0.5 nm/250×250 μm² with the proviso that any P-V value of recesses 10 is in the range of 13 nm/250×259 μm² or less.

A support 5 of the present invention may be Si single crystal or polycrystal wafers.

According to such a technical means, even when a heat treatment is conducted at about 1200° C., a substrate for semiconductor integrated circuits can be produced with a perfect wafer bonding structure being free of voids, and a heat treatment can be conducted with a commercially available high-purity quartz glass tube and thus the costs of production facilities for such a heat treatment and the production itself are reduced.

The present invention makes it possible to realize a heat treatment at a temperature on the order of 1200° C. and a time period on the order of 2 hours, and further reduces the production cost due to facilitation of mass production.

BRIEF DESCRIPTION OF THE DRAWINGS

Novel features which are considered characteristic of the present invention are set forth with particularity in the appended claims.

The invention itself, however, and additional objects and advantages thereof will best be understood from the following description thereof when read in connection with accompanying drawings, in which.

DETAILED DESCRIPTION OF THE INVENTION

Figure 1:
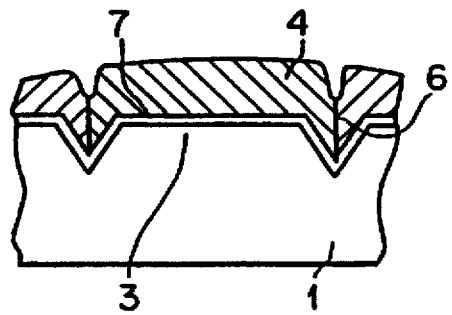
FIGS. 1(a) to 1(d) are sectional views illustrating in sequence the processing steps of a method for producing a substrate to achieve semiconductor integrated circuits according to the present invention.
Figure 1:
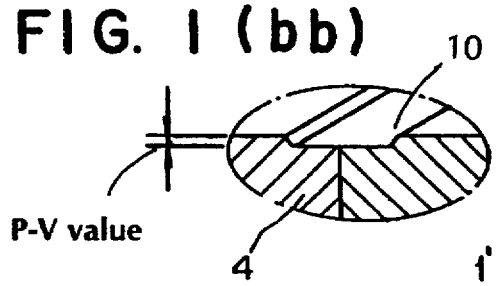
Figure 1:
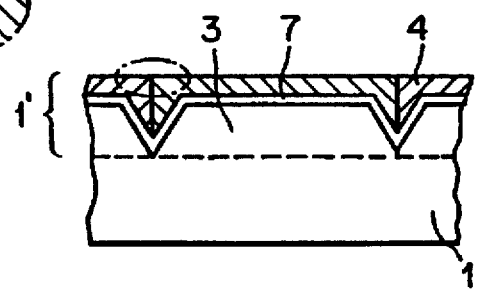
Figure 1:
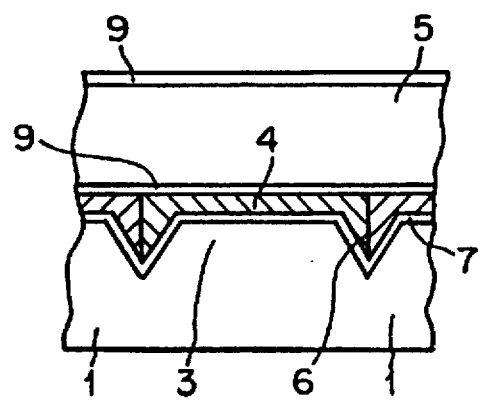
Figure 1:
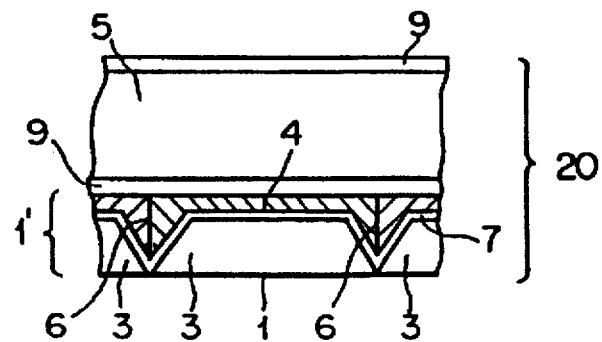
Figure 2:
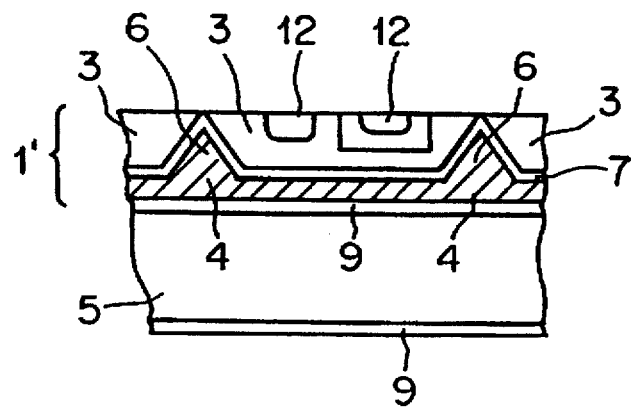
FIG. 2 is a sectional view of a substrate for semiconductor integrated circuits to which the present invention is applied.

Examples of the present invention provided below are illustratively described in depth with reference to the accompanying drawings.

As far as specific descriptions are not made in regard to the dimensions, materials and shapes of constructing parts, and their relative configuration in the examples, it should be understood that the scope of the invention is not limited to the descriptions themselves and they are intended to be illustrations only.

In the examples Si was used as a semiconductor material. Si single crystal wafers 1 to 6 inches in diameter and 625 µm thick were prepared. A main surface of a Si single crystal wafer 1 was oxidized to form a $SiO_2$ film across the whole surface. Patterning was carried out on the $SiO_2$ film by Photolithography or the like. Windows were opened at predetermined spots in the $SiO_2$ film. Anisotropic etching in which a liquid mixture including potassium hydroxide and iso-propyl alcohol were used, was carried out using the patterned $SiO_2$ film as a mask to form V grooves 6 for isolation of about 50 µm deep. The $SiO_2$ film, which had been used as a mask, was removed. Oxidation was again carried out on the main surface of the wafer 1 to form another $SiO_2$ film 7 for insulation. This $SiO_2$ film had a thickness of about 2.0 µm, across the whole surface. A Si polycrystal layer 4 was built-up to a thickness sufficient, e.g. about 100 µm, on the surface by chemical vapor deposition to at least perfectly fill up the V grooves 6 for isolation (see FIG. 1(a)). Large scale recesses in the built-up Si polycrystal layer 4 were removed by mechanical cutting or grinding. These recesses were located right above the V grooves 6 and formed due to the deepness of the V grooves 6. Minute unevenness was removed by mechano-chemical polishing to achieve a flat and smooth surface.

On the polished surface of the Si polycrystal layer 4 the chemical etching speed is larger in the regions directly above V grooves 6 than in the other regions. As a result, patterned steps 10, which are evaluated in the P-V value, are formed in the interposed regions between Si single crystal islands 3 and the V grooves 6 for isolation (see the enlarged view of recess 10 in FIG. 1(b)).

Figure 3:
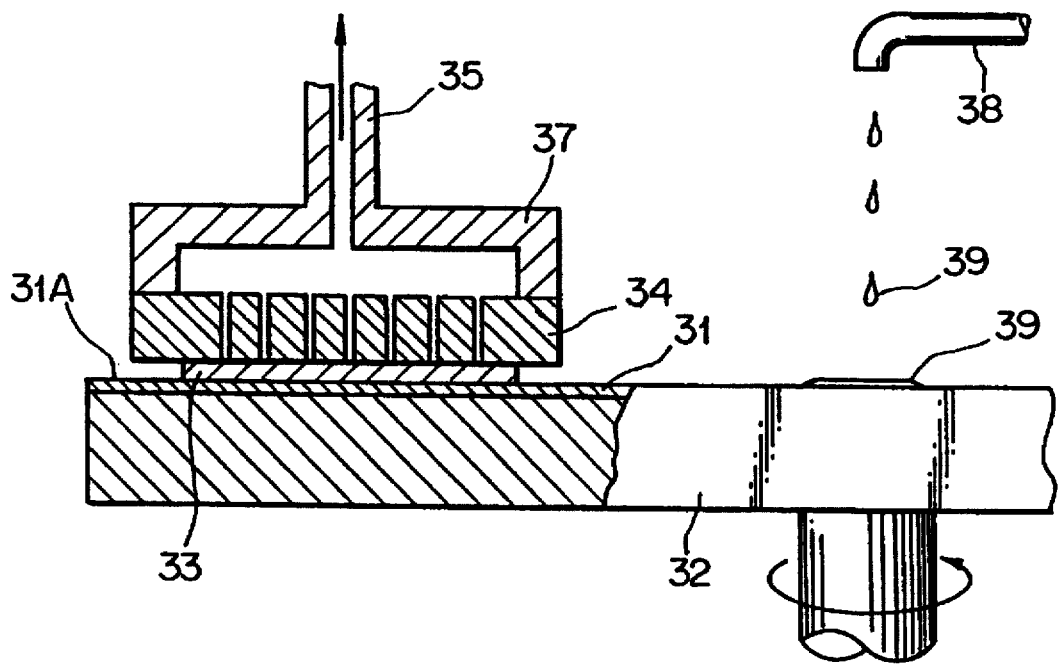
FIG. 3 is a schematic view showing a polishing apparatus for the bonding surface of an polycrystal silicon layer used in an embodiment of the present invention.

A mechano-chemical polishing method adopted for use in the present invention uses, for example, an apparatus shown in FIG. 3, which comprises: a turn table 32, across the upper surface of which a polishing cloth of low compressibility is attached and which turn table turns about its center by receiving an external force; a plate 34, which is positioned on the surface 31A of the polishing cloth and, on the lower surface of which plate one or more wafers 33 are fixed; and a mount head 37, which applies a pushing force to the plate 34 from its upper side by the use of pressure shaft 35.

The apparatus is operated in such a manner that the single crystal silicon wafer 33 receives a predetermined polishing by frictional movement between the wafer 33 and the polishing cloth 31, while a polishing slurry 39 of weak alkalinity to near neutrality, which includes, for example, abrasive grains of $SiO_2$, is dispersed over the polishing cloth 31 by the use of a polishing slurry supplier 38.

According to such a polishing method, since the polishing slurry 39 is close to neutral instead of being strongly alkaline as those of the prior art, the polishing speeds are made uniform on a Si polycrystal layer 4, more particularly, between right above V grooves 6 and above Si single crystal islands 3.

In a concrete manner of explanation, the chemical etching speed in the regions of V grooves 6 can be controlled to be close to the etching speeds in the other regions and, as a result, the P-V values of recesses 10 between the Si single crystal islands 3 and V grooves 6 can be diminished to between about 9 nm to 13 nm as compared to 20 nm of the prior art.

In order to conduct comparative experiments in parallel with the examples of the present invention, various wafers (hereinafter referred to as first wafers), the P-V values of which are within the range of 9 nm to 30 nm, were prepared. The first wafers were divided into groups on the basis of the average P-V values from the data at each set of the three points for measurement in the recesses 10, as discussed below.

Figure 4:
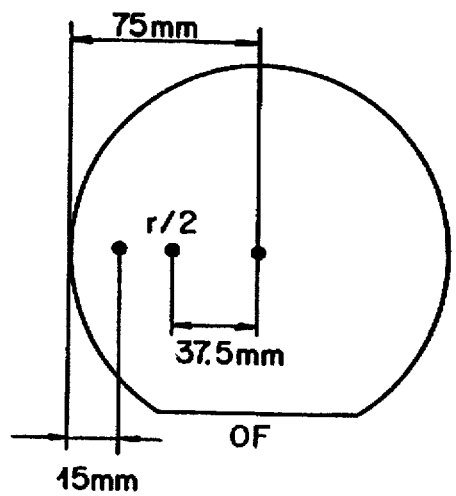
FIG. 4 is a schematic diagram showing measuring points for a P-V value.

In measurement of the recesses 10, Non-contact Microsurface Measurement Systems TOPO-3D, made by WYKO Corporation was used. The measured positions were, as shown in FIG. 4, three points, which comprise the center, a point at r/2 from the center and a point of 15 mm from the periphery. The area covered by each measurement was a square of 250 µm×250 µm for each point.

Further, second Si single crystal wafers (hereinafter referred to as second wafers) for supports 5, with an insulating layer of a $SiO_2$ thereon and thickness of about 500 nm to 1500 nm on a main surface, were prepared.

Each pair of first and second wafers were superimposed between respective polished surfaces, one of which was the polished surface of the Si polycrystal layer 4 and the other of which was covered with an oxide layer. Each pair of wafers as superimposed were bonded by conducting heat treatments at such temperatures of 1000° C., 1050° C., 1100° C., 1200° C. and 1250° C. and time periods of 2 to 3 hours (see FIG. 1(c)).

Measurements of voids were conducted on the resulting bonded substrates. The measuring instrument for measurement of voids was Scanning Acoustic Tomograph AT5500, made by HITACHI kenki k.k. with an operating frequency of 75 MHz. The area coverage of measurement was the whole surface of each of the substrates, which was 6 inches in diameter. The void areal ratio was calculated on the basis of measurement of voids in the limited surface regions, which corresponded to patterned steps thereunder.

At the last step, the unnecessary part of each of the second Si single crystal wafer was removed by polishing to form Si single crystal islands 3, so that substrates for semiconductor integrated circuits were produced (FIG. 1(d)).

Table 1 summarizes data relating to the relationship among the patterned step, heat treatment conditions for bonding and void areal ratio for thicknesses of the dielectrically insulating layers, which were each an $SiO_2$ layer, in the range of 500 nm to 1500 nm. The results of Table 1 show that, when P-V values are controlled at about 10 nm as in the examples, the void areal ratios are zero % or close to zero % at a heat treatment temperature in the range of 1100° C. to 1200° C. and time periods in the range of 2 hours to 3 hours, regardless of the thickness of a dielectrically insulating layer.

On the other hand in the comparative examples, even when P-V values are about 10 nm, the void areal ratios are high at temperatures less than 1100° C. On the other hand, when P-V values are chosen at 13 nm or larger, the void areal ratios are not significantly improved, even when the heat treatment temperature is raised up to 1200° C. as in the examples, and even when the heat treatment temperature is further raised to 1250° C.

interface are controlled to have a depth of 13 nm or less and heat treatment is carried out at 1200° C. and 2 hours, it was confirmed that no void occurs and thus voidless substrates for semiconductor integrated circuits can be produced, due to fluidisation of the oxide film formed on a support 5.

We claim:

1. A method for producing a substrate for semiconductor integrated circuits comprising the following steps of:

forming V grooves in a main surface of a first Si single crystal wafer;

forming an oxide layer on the main surface of the first Si single crystal wafer and on an inner surface of each groove in the main surface;

depositing a Si polycrystal layer on the main surface to fill up the grooves;

smoothing a surface of the Si polycrystal layer to reduce P-V values of any recesses to be within the range of 13 nm/250×250 µm² or less where a P-V value is defined as the maximum depth measured in nm from the highest point of adjacent plateaus to the lowest bottom of recess within a limited area of 250×250 µm² around the recess;

forming an oxide layer on a main surface of a second Si wafer support;

superimposing the Si polycrystal layer 4 and the support with a dielectrically insulating layer lying therebetween;

conducting heat treatment of the superimposed Si single crystal wafer and the support at a temperature in the range of 1100° C. to 1250° C. to effect bonding therebetween; and

TABLE 1

| | | Experimental Conditions | | | | | | |
|---|---|---|---|---|---|---|---|---|
| | | P-V Values nm | | | Thickness of Dielectrically | Heat Treatment Conditions for | | Results |
| | Serial | | 15 mm from | | Insulating Layer(SiO₂) | Bonding | | Void Areal |
| | No. | Center | r/2 | Periphery | Average | nm | Temp. °C. | Hour hrs | Ratio % |
| Examples | 1 | 11.0 | 10.8 | 9.1 | 10.3 | about 1500 | 1100 | 2 | 5 |
| | 2 | 9.0 | 10.3 | 12.6 | 10.6 | about 1500 | 1200 | 2 | 0 |
| | 3 | 10.5 | 11.0 | 10.1 | 10.5 | about 500 | 1100 | 2 | 8 |
| | 4 | 9.8 | 10.2 | 9.5 | 9.8 | about 500 | 1100 | 3 | 0 |
| | 5 | 9.4 | 9.6 | 9.1 | 9.4 | about 500 | 1200 | 2 | 0 |
| Comparative | 1 | 10.1 | 11.4 | 10.0 | 10.5 | about 1500 | 1000 | 2 | 100 |
| Examples | 2 | 9.6 | 10.3 | 10.9 | 10.3 | about 1500 | 1050 | 2 | 17 |
| | 3 | 12.8 | 13.5 | 16.3 | 14.2 | about 1500 | 1200 | 2 | 22 |
| | 4 | 21.5 | 23.8 | 19.8 | 21.7 | about 500 | 1200 | 2 | 35 |
| | 5 | 23.3 | 28.5 | 24.8 | 25.5 | about 500 | 1250 | 2 | 28 |

Figure 5:
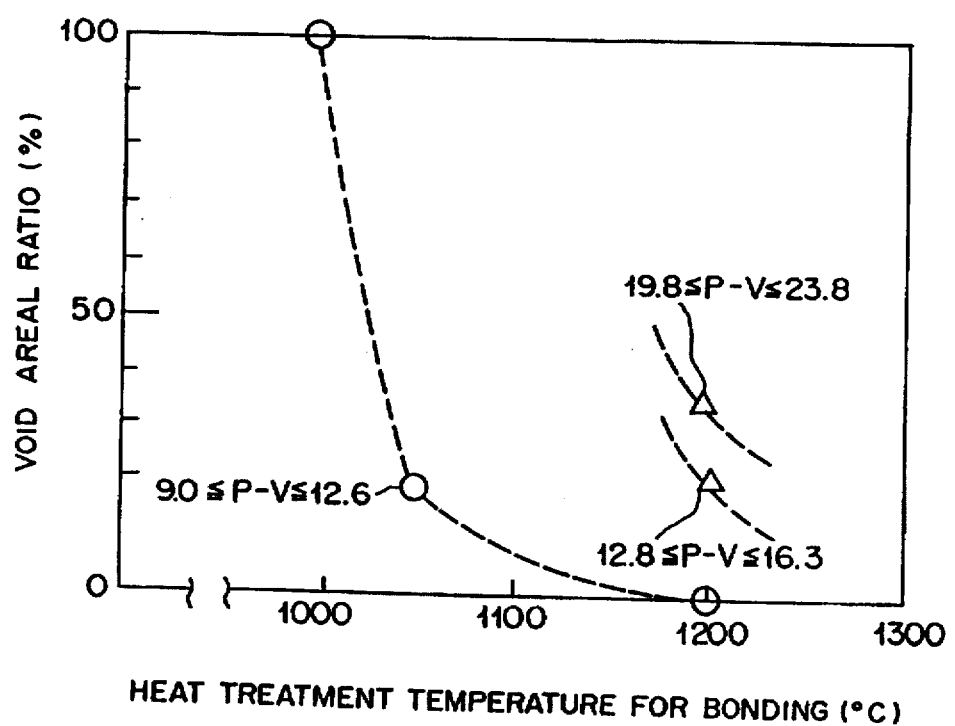
FIG. 5 is a graph showing the relationship between the void areal ratio in % and the heat treatment temperature in ° C. for bonding.

FIG. 5 shows the relationship between the P-V value and the heat treatment temperature for bonding and the void areal ratio, when the time period of heat treatment is kept at 2 hours. As is shown in this FIG. 5, when the P-V value is controlled at 13 nm or less, the void areal ratio at 1200° C. becomes zero %. In another case using the same P-V value where the temperature is 1100° C., the void areal ratio is about 10%. In this later case, the void areal ratio can be improved by extending the time period of the heat treatment. On the contrary, when the P-V value is controlled in the range of 12.8 nm to 16.3 nm or in the range of 19.8 nm to 23.8 nm, the void areal ratio is respectively 22% and 35% for a heat treatment temperature of 1200° C. It is estimated that a heat treatment temperature of 1250° C. or higher will produce void areal ratios that approach zero % in both cases.

Consequently, according to the examples, when recesses 10 on the surface of an Si polycrystal layer 4 at a bonding removing portions of another main surface region of the first silicon wafer to form isolated islands.

2. A method for producing a substrate for semiconductor integrated circuits as claimed in claim 1, wherein the dielectrically insulating layer is made of silicon oxide and has a thickness in the range of 13 nm to 2000 nm.

3. A method for producing a substrate for semiconductor integrated circuits as claimed in claim 2, wherein the dielectrically insulating layer has a thickness in the range of 12 nm to 1500 nm.

4. A method for producing a substrate for semiconductor integrated circuits as claimed in claim 1 wherein the heat treatment for bonding is conducted at a temperature in the range of 1100° C. to 1250° C. and a time period in the range of 3 hours or less.

* * * * *